United States Patent [19]

Hagedon et al.

[11] Patent Number: 5,405,000
[45] Date of Patent: Apr. 11, 1995

[54] PROTECTIVE SUSPENSION PACKAGE

[76] Inventors: Bryan D. Hagedon, 559 Wisconsin, San Francisco, Calif. 94107; Wendy K. Whitacre, 206 Nieto, #B, Long Beach, Calif. 90803

[21] Appl. No.: 203,161

[22] Filed: Feb. 28, 1994

[51] Int. Cl.6 .................... B65D 81/02; B65D 85/30
[52] U.S. Cl. ..................... 206/216; 206/332; 206/583
[58] Field of Search ............... 206/216, 218, 328, 332, 206/466, 467, 470, 493, 583, 594

[56] References Cited

U.S. PATENT DOCUMENTS

| | | |
|---|---|---|
| 2,700,460 | 1/1955 | Hoover .................. 206/583 |
| 3,853,220 | 12/1974 | Luray . |
| 4,241,829 | 12/1980 | Hardy . |
| 4,557,379 | 12/1985 | Lane et al. . |
| 4,606,459 | 8/1986 | Luray . |
| 4,606,460 | 8/1986 | Luray . |
| 4,852,743 | 8/1989 | Ridgeway ............ 206/583 |
| 4,903,827 | 2/1990 | Phelps et al. . |
| 5,056,665 | 10/1991 | Boecker et al. . |
| 5,183,159 | 2/1993 | Hojnacki et al. . |
| 5,226,542 | 7/1993 | Boecker et al. . |
| 5,251,760 | 10/1993 | Smith et al. ......... 206/583 |

Primary Examiner—Jacob K. Ackun, Jr.
Attorney, Agent, or Firm—Andrus, Sceales, Starke & Sawall

[57] ABSTRACT

A suspension package for sensitive articles includes an article-enclosing flexible bag and an outer enclosing clamshell container having shell halves with abutting edge portions which trap the bag edges therebetween upon closure. A closure mechanism allows the bag and article to be initially supported on one shell half and, upon shell closure, to impart tension to the bag and to hold the shells tightly closed. The clamshell and bag are made of plastic materials, either or both of which may be static dissipative.

17 Claims, 6 Drawing Sheets

PROTECTIVE SUSPENSION PACKAGE

BACKGROUND OF THE INVENTION

The present invention pertains to packaging for articles which are sensitive to physical shock and/or transient electrical charges and, more particularly, to a suspension package utilizing a composite of two common packaging components.

A wide variety of packages used to protect fragile articles are shown in the prior art. The shipping and storage of fragile articles, such as glass pieces and bottles, delicate instruments, and electronic components, all require protection against physical shock. In addition, delicate instruments and electronic components may also require protection against transient electrical charges, such as static electric build-up and discharge. Indeed, as the electronics and computer industries continue to grow, the hazards of static electric discharge and other transient electric currents to highly sensitive products become increasingly acute and must be prevented. Packaging materials must be made to protect these products as they travel through the uncontrolled environments in the chain of distribution, including initial packaging, shipping, handling, sale and end use.

A variety of suspension packaging systems have been developed for protecting fragile articles during shipment and related handling. Examples of these suspension packages are shown in U.S. Pat. Nos. 3,853,220; 4,606,459; 4,606,460; 5,056,665; and 5,226,542. In each of these patents, the fragile article is placed in a thin plastic sleeve or hammock and the ends of the hammock are closed and suspended between the opposite walls of an outer container made, for example, from corrugated paperboard or the like. The outer container is typically provided with means for tensioning the hammock between the supporting walls to assure that the hammock and fragile article remain suspended in the closed container. Other embodiments in the foregoing patents utilize more rigid plastic cradles which hold the fragile articles and are suspended between opposite walls of the outer enclosing container.

Another approach to suspension packaging is shown in U.S. Pat. Nos. 4,903,827; 5,183,159; and 5,218,510. In these patents, the fragile article is suspended between two layers of thin plastic film material, each of which films is supported by an outer frame and which frames may comprise the edges of an enclosing outer container. U.S. Pat. No. 5,218,510 also teaches the use of suspension film layers which are heat shrinkable and static discharge protective and which enclose both the fragile article and the outer container to provide a continuous conductive coating to protect against static electric discharge.

Packages which provide cushioning against physical shock and also protection against static discharge are shown in U.S. Pat. Nos. 4,241,829 and 4,557,379. However, neither of the foregoing patents utilizes an article suspension device as previously described. Prior art cushioned containers which conform to the size and shape of the article enclosed therein require multiple container shapes for articles of varying size and shape.

The prior art suspension packages, on the other hand, though capable of accommodating some range of articles of different shapes and sizes are typified by complex constructions and/or features which make article insertion and package closure tedious and time consuming.

There is a need, therefore, for a package and packaging method which utilizes conventional packaging components which are inexpensive, can be assembled easily and quickly, provide good protection against physical shock, and may be made static dissipative if required. In addition, a package having the foregoing features and which may be made to accommodate a broad range of product shapes and sizes would be particularly attractive from the standpoint of inventory reduction and packaging parts simplicity.

Summary of the Invention

In accordance with the present invention, a suspension package and method for packaging a sensitive article utilize a conventional thin film plastic bag suspended and enclosed in a thermoformed plastic clamshell. Opposite marginal portions of the bag are adapted to overlie abutting edge portions of one of the enclosing shells and a closure mechanism is operative to capture the marginal portions of the bag between the edge portions of the shells when they are closed, to tension the bag in a direction transverse to the captured marginal portions and suspend the bag and enclosed article within the open package interior, and to hold the shells closed. The clamshell preferably includes an integral hinge interconnecting the two shells. In the preferred embodiment, the closure mechanism includes patterns of interfitting protrusions and recesses on the edge portions of the shells, perforations in the opposite marginal portions of the bag which allow the bag to be placed over the protrusions and held with the marginal bag portions overlying the shell edge portions, and the recesses formed in the opposite edge portions of the other shell receiving the protrusions when the shells are closed. The closure mechanism may also include mating tongue and groove connections on opposite pairs of abutting edge portions of the shells, whereby the marginal edge portions of the bag are captured in the mating tongue and groove connections when the shells are closed to provide bag tension.

The plastic shells and/or plastic bag may be manufactured from static dissipative materials or treated after manufacture to be static dissipative. Preferably, both the shells and the bag are made from a static dissipative material. The bag is preferably made from a conventional plastic film, such as polyethylene, and the shell may be formed from any of a number of suitable thermoplastics, such as PET, including recycled PET.

In the preferred embodiment, the closure mechanism comprises opposed wall portions extending along the inner peripheries of the edge portions of the shells, which wall portions are adapted to operatively engage in the closed shell position to tension the bag and hold the shells closed. Preferably, the opposed wall portions comprise a substantially continuous groove in the edge portion of one shell, and a mating rib on the edge portion of the other shell. In the preferred embodiment, the groove and rib include undercut abutting faces which are adapted to lock the shells closed and trap the marginal bag portions therebetween.

The method of the present invention for packaging an article to protect the same against physical shock includes the steps of: placing the article in a generally rectangular flexible plastic bag, providing the bag with marginal connector portions along opposite bag edges, providing a pair of plastic shell halves having respective edge portions defining generally rectangular peripheries, providing the opposite edge portions of one shell with edge connector portions, attaching the marginal connector portions to the edge connector portions to suspend the bag between the opposite edge portions, providing the inner peripheral edges of the edge portions of both shell halves with interfitting wall portions, and closing the shell halves by bringing the edge portions into abutting face-to-face relation and tensioning the bag by capturing the same between the interfitting wall portions.

The method also includes the step of treating the plastic material for the bag and shell halves to render the material static dissipative. Preferably, the method also includes the steps of providing the interfitting wall portions with undercut faces, and causing the wall portions to deflect on closing to lock the shell halves closed.

DETAILED DESCRIPTION OF THE PREFERRED EMBODIMENTS

FIGS. 1-4 show the presently preferred embodiment of the invention. The package of composite construction includes an outer clamshell container 10 and an inner plastic bag 11. The bag holds a sensitive article 12 which must be protected from physical shock and/or transient electrical charges. The clamshell container is preferably thermoformed from any of a wide variety of suitable thermoplastics, such as polyethylene terephthalate (PET). The container 10 includes shell halves 13 and 14 which are connected by an integral hinge 15. Each of the shell halves 13 and 14 includes an outer wall 16 enclosed by an integral peripheral frame 17 to define therein an open interior 18. Each of the peripheral frames 17 includes a raised edge portion 20 which is connected to the wall 16 by an inner skirt 21 and which has attached to and downwardly depending from its opposite outer edge an outer skirt 22.

The frames 17 are generally rectangular in shape and the edge portions 20 of the two shell halves 13 and 14 abut when the halves are brought together to establish the closed shell position. The plastic bag 11 is also generally rectangular in shape and includes an open end 23 for receipt of the article 12, an opposite closed end 24, and a pair of opposite marginal portions 25. The bag 11 is dimensioned and sized to overlie the peripheral frame 17 of shell halve 13, including the edge portions 20.

The opposite marginal portions 25 of the bag are provided with a series of holes 26. One pair of opposite edge portions 27 of the shell half 13 is provided with a series of posts 28 which protrude upwardly from the surfaces of the edge portions 27. The posts 28 are sized and spaced to be received in the holes 26 in the marginal portions 25 of the bag. The pair of edge portions 30 in the other shell half 14, which abut the edge portions 27 of shell 13 when the clamshell 10 is closed, are provided with a series of recesses 31 adapted to receive therein the posts 28 in the closed shell position.

The holes 26 along the marginal portions 25 of the bag are adapted to be received on the posts 28 on the shell half 13 easily and without any significant stretching of the bag. In this preliminary installation position, the marginal portions 25 of the bag overlie the edge portions 27 of the clamshell 13, while the opposite edges of the bag defining the open end 23 and closed end 24 overlie the other pair of opposite edge portions 32. In this position, the bag 11 may sag somewhat under the weight of the article 12, and the article itself is only loosely captured in the bag. In addition, the open end 23 of the bag is unsealed. A continuous groove 33 is formed in the face of the inner peripheral edge of the edge portions 20 of shell half 13. Thus, the groove extends continuously along edge portion pairs 27 and 32. A mating rib 34 is formed along the inner peripheral edge of the edge portions 20 of the other shell half 14. Similarly, the rib 34 thus runs continuously along opposite edge portion pairs 30 and 35 of shell half 14.

Shell half 14 is brought over the top of shell half 13 to bring their respective edge portions 20 into abutting relationship, to cause the posts 28 to be received in the recesses 31 and to capture the bag edges therebetween. Simultaneously, the rib 34 of shell half 14 is received in the groove 33 in shell half 13 capturing the bag edges therebetween. As the bag margins are forced into the groove 33 by the rib 34, the bag is tensioned in all four directions normal to the edges of the rectangular frame 17. Also, the open end 23 of the bag is sealed. The resulting bag tension eliminates any sagging which might allow damaging contact between the article 12 and an outer wall 16 as a result of physical shock, and the article itself is tightly secured between the two tensioned layers of the bag 11 thereby preventing any sliding movement of the article in the bag.

Figures 2, 3, 4:
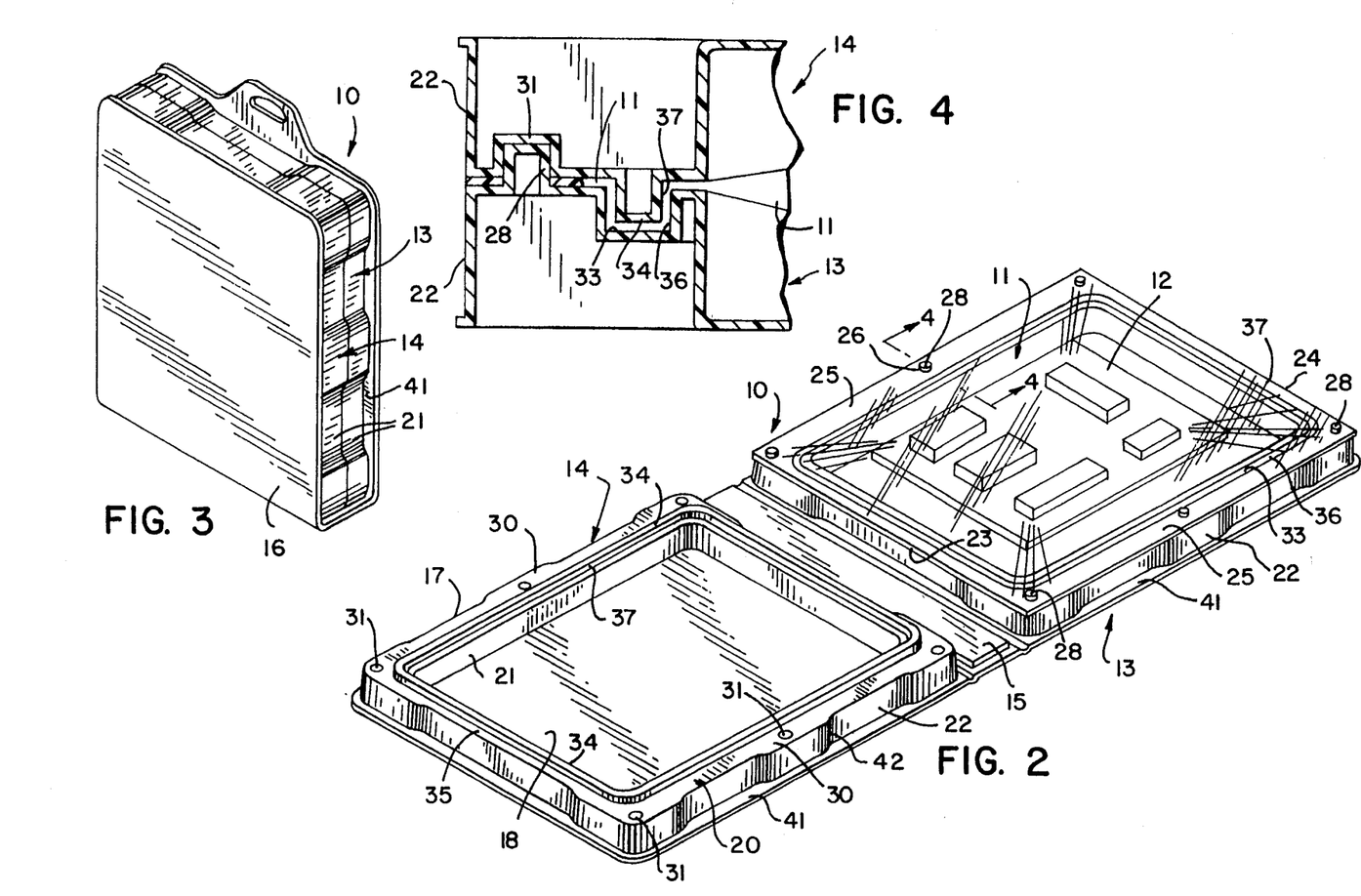
FIG. 2 is a perspective view of the package shown in FIG. 1 in its preliminary assembled condition.
FIG. 3 is a perspective view of the closed package of the subject invention.
FIG. 4 is a sectional view taken on line 4—4 of FIG. 2.

To lock the clamshell 10 in the closed position, opposing wall portions of the groove 33 and rib 34 such as groove wall 36 and rib wall 37, are provided with a taper or back draft which locks the rib in the groove and helps hold the tension on the bag. The inherent flexibility of the thermoformed clamshell material provides adequate deflection to allow the interfering back draft walls 36 and 37 to move into the closed and locked position.

Figure 1:
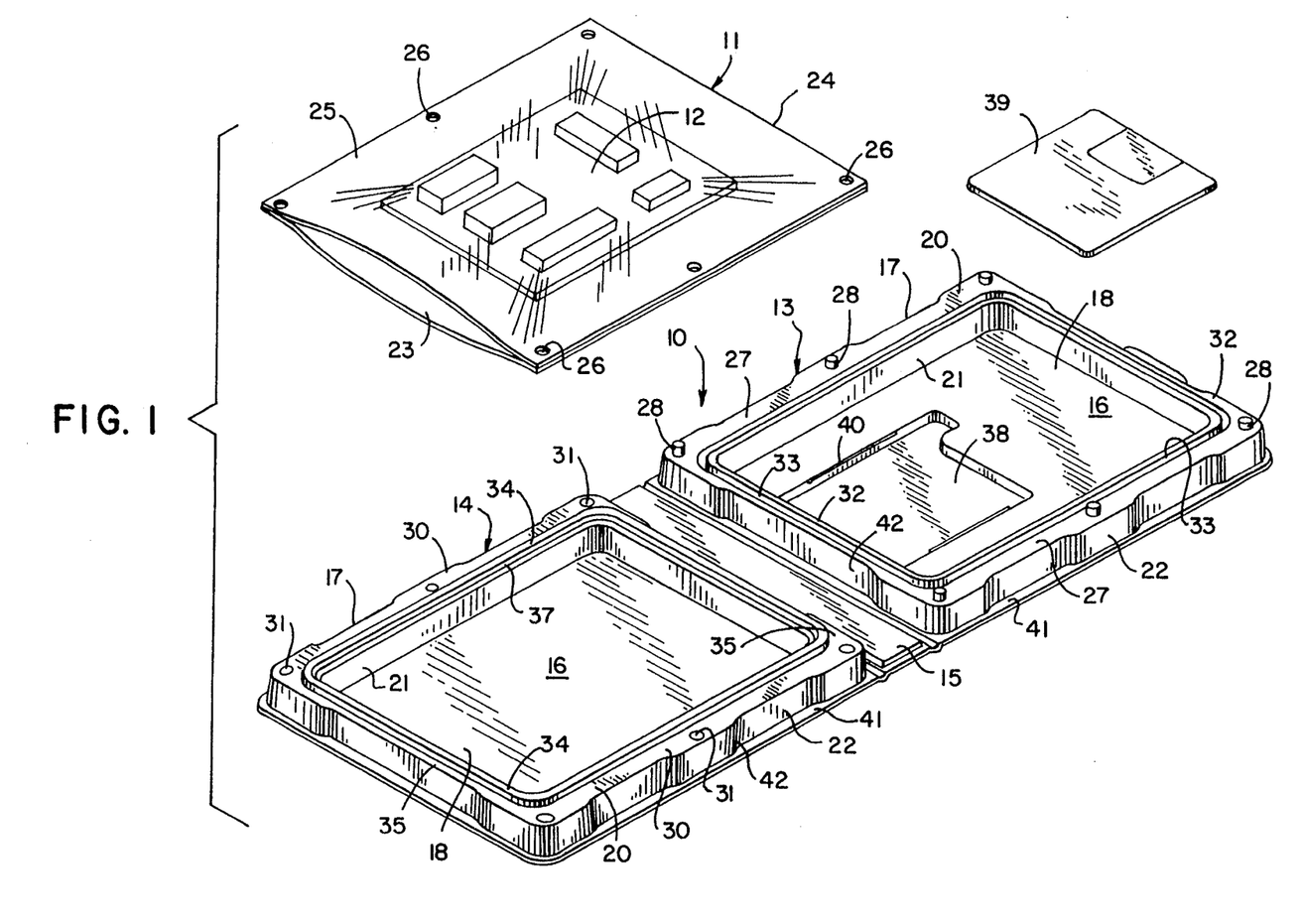
FIG. 1 is an exploded view of the presently preferred embodiment of the present invention, showing a sensitive article being packaged therein and an additional item for enclosure therewith.

The inner surface of one shell wall 16 may be provided with a recessed area 38 into which an additional article 39 or printed materials may be placed and held, as with locking tabs 40. The outer skirts 22 of each of the shell halves 13 and 14 may define recessed portions 42 and lower flanged edges 41 to enhance strength and rigidity.

It is also possible to utilize means other than the posts 28 and recesses 31 to initially position the bag prior to clamshell closure. For example, the posts 28 could be replaced by sharpened upstanding points to pierce the marginal portions 25 of the bag. Also, the edge portions 20 of one of the shell halves or even the outer skirts 22 thereof could be provided with slits into which the corners of the bag could be inserted for temporary positioning, the slits possibly also being provided with barbed or serrated edges to enhance gripping and holding the bag. The bag margins might also be provided with narrow strips of a low tack adhesive to allow the bag to initially overlie the frame 17 of one shell half before closure; a rubber band or other flexible collar might also be used (and removed subsequent to clamshell closure). Alternately, the bag 11 might be supported to overlie one shell half with a fixture separate from the shell itself. For example, the holes in the bag margins may be placed over upstanding posts between which the shell half is positioned to hold the bag until the other shell half is closed thereon. It is, of course, also possible to eliminate the integral hinge 15 and utilize separate shell halves 13 and 14.

Figure 5:
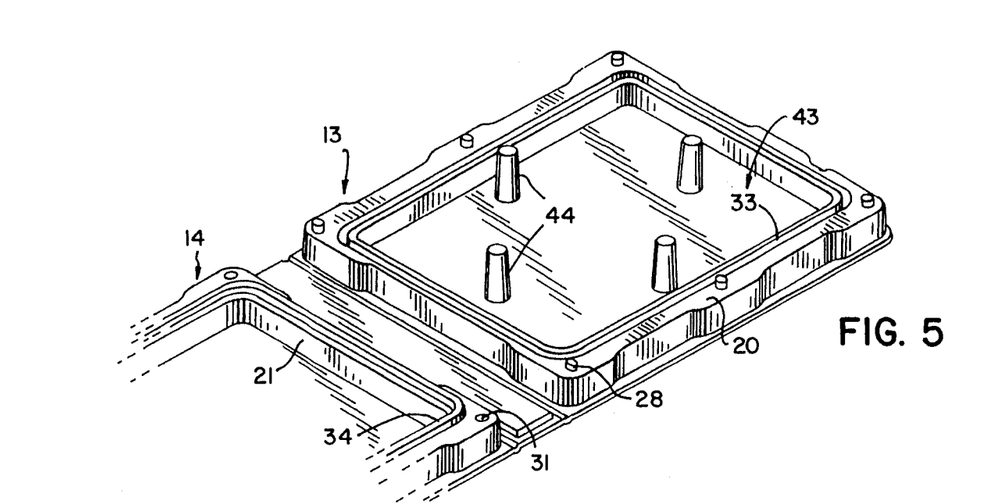
FIG. 5 is a perspective detail of a supplemental tensioning device shown in use with the outer clamshell container of the preferred embodiment.
Figure 6:
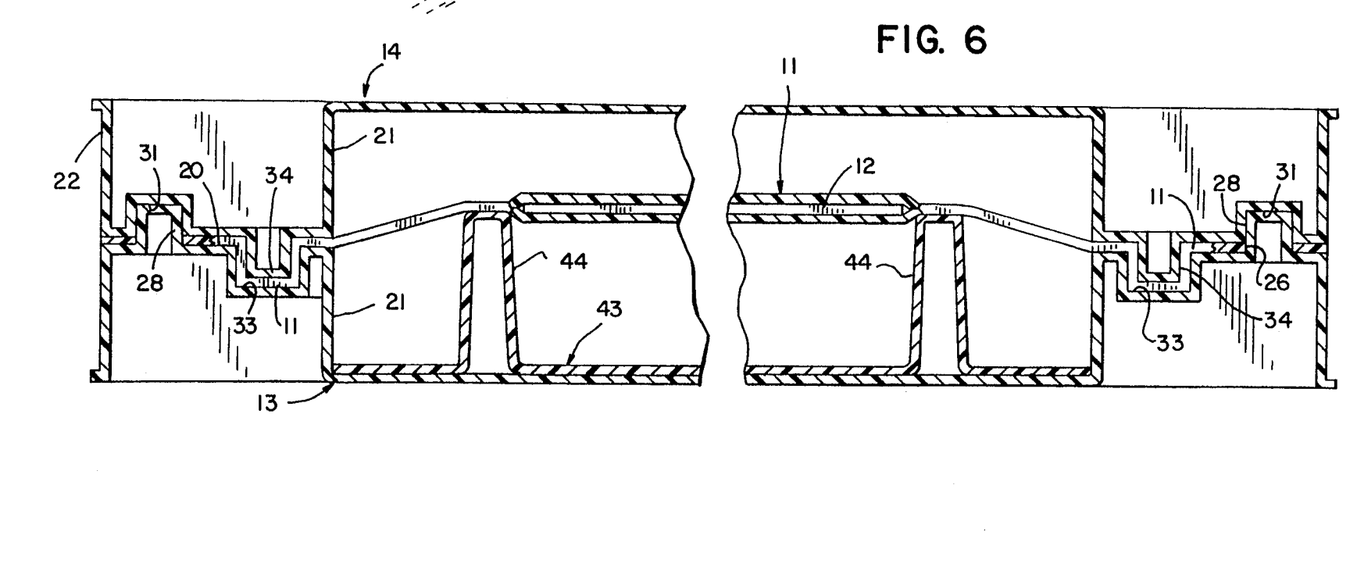
FIG. 6 is a sectional view through the container of FIG. 5 in the closed position.

The typical article 12 of the type particularly suitable for packaging in the subject invention includes a circuit board for a computer or other electronic device. The board itself is typically flat, but the various components in the circuit, such as chips and other discrete devices, are mounted on the circuit board and protrude from one or both surfaces thereof. A typical circuit board may also include a mounting bracket along one edge. It has been found that the many corners and edges presented by such circuit boards allow them to be gripped more readily by the two layers of the enclosing plastic bag 11 and, after tensioning, tend not to slide as readily as thin, smooth-surfaced articles. However, supplemental means may be provided, regardless of the article being packaged, to further inhibit sliding movement of the article within the bag. For example, after the article is inserted in the bag, a supplemental inner heat sealed seam may be provided to seal both layers of the bag with a seal around and closely spaced from the perimeter of the article. Alternately, as shown in FIGS. 5 and 6, a separate insert 43 may be placed in one of the shell halves, such as against the outer wall 16 of shell half 14, as shown. The insert 43 has four integral upstanding legs 44 of a length greater than the depth of the shell so that they extend beyond the plane of the edge portion 20. When the shell halves are closed and the bag is tensioned, the ends of the legs 44 will also engage and deflect the bag, thereby providing supplemental tension. The legs may be spaced and oriented to lie immediately adjacent each of the edges of the article 12 in the bag.

An alternate embodiment of the subject invention is shown in FIGS. 7-11 and includes a clamshell container 50 and plastic bag 51 which are similar in many respects to the corresponding container 10 and bag 11 of the previously described preferred embodiment. The differences in construction and function will be described hereinafter. The shell halves 53 and 54 are connected by an integral hinge 55. The outer walls 56 of the shells are surrounded by an integral raised peripheral frame 57 defining an open interior 58 in each frame. An inner skirt 61 departs substantially from the rectangular shape of the inner skirt of the previously described embodiment and, in this embodiment, the inner skirt 61 defines edge portions 60 which comprise pairs of opposite side bosses 62 and end bosses 63, connected by recessed corners 64. In shell half 53, the side bosses 62 define a pair of edge portions 67 each of which includes a series of posts 68 and a tensioning groove 65. Similarly, the side bosses 62 on the shell half 54 define edge portions 70 each of which include post recesses 71 and a tensioning rib 69. Similarly, the end bosses 63 in shell half 53 define edge portions 72 which are provided with tensioning grooves 65, while the end bosses 63 in shell half 54 define edge portions 75 having tensioning ribs 69.

The plastic bag 51 is initially positioned over shell half 53 such that the bag edges overlie the edge portions 67 and 72 and the bag is held in position on posts 68. When the shell half 54 is closed onto shell half 53, the posts 68 are received in the recesses 71 and the tensioning ribs 69 are received in tensioning grooves 65. In this embodiment, the clamshell 50 is held closed and locked with a mechanism separate from the tensioning grooves 65 and ribs 69. Instead, the outer periphery of the edge portion 60 of shell half 53 is provided with a continuous groove 73 and the corresponding edge portion of shell half 54 is provided with a continuous rib 74. Locking is assured by providing the groove and rib with a respective undercut groove wall 76 and undercut rib wall 77. Otherwise, the clamshell container 50 and plastic bag 51 may include the same alternate constructions described with respect to the preferred embodiment, including the use of static dissipative plastic material for their constructions.

Figure 7:
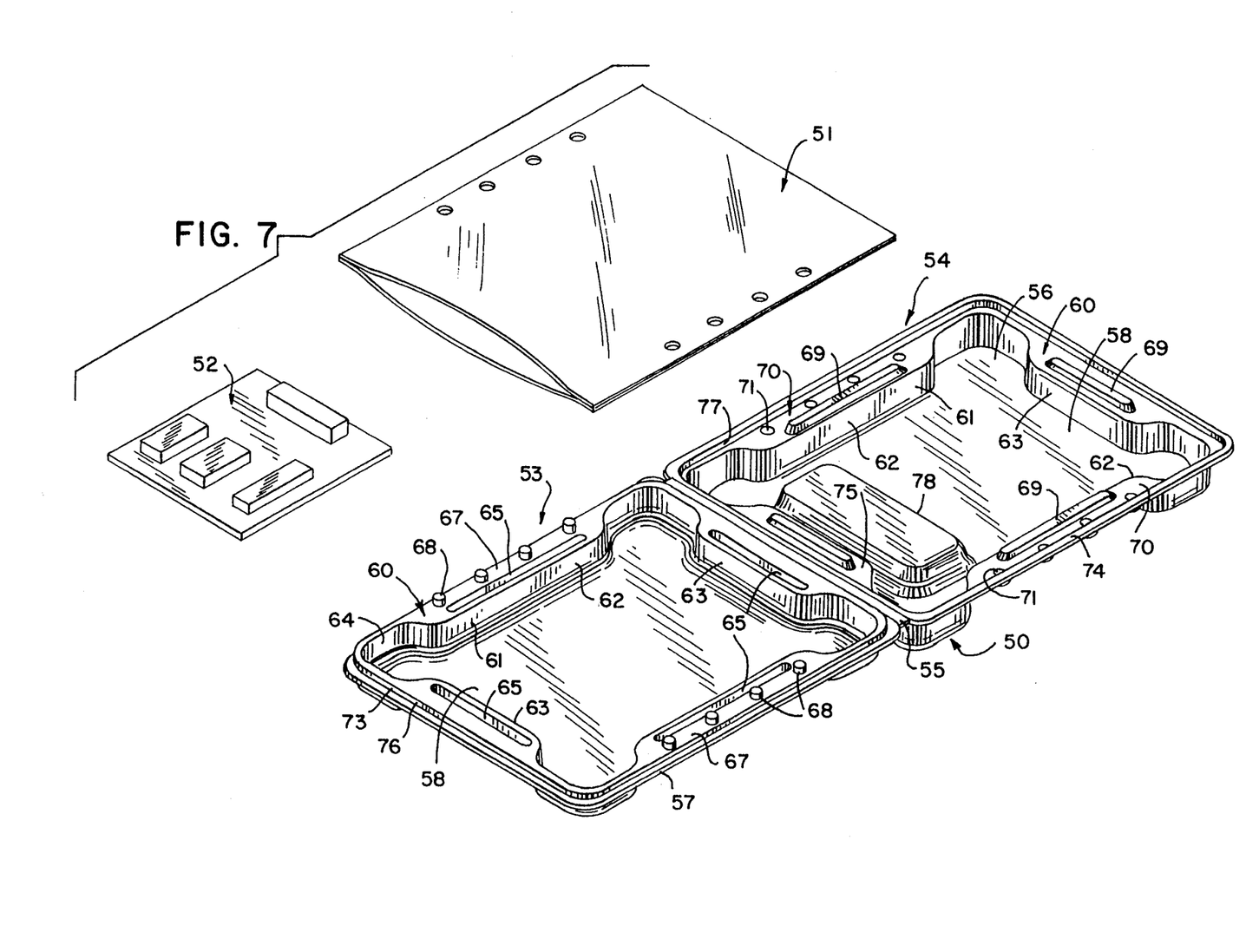
FIG. 7 is an exploded view of an alternate embodiment of the present invention.
Figures 8, 9:
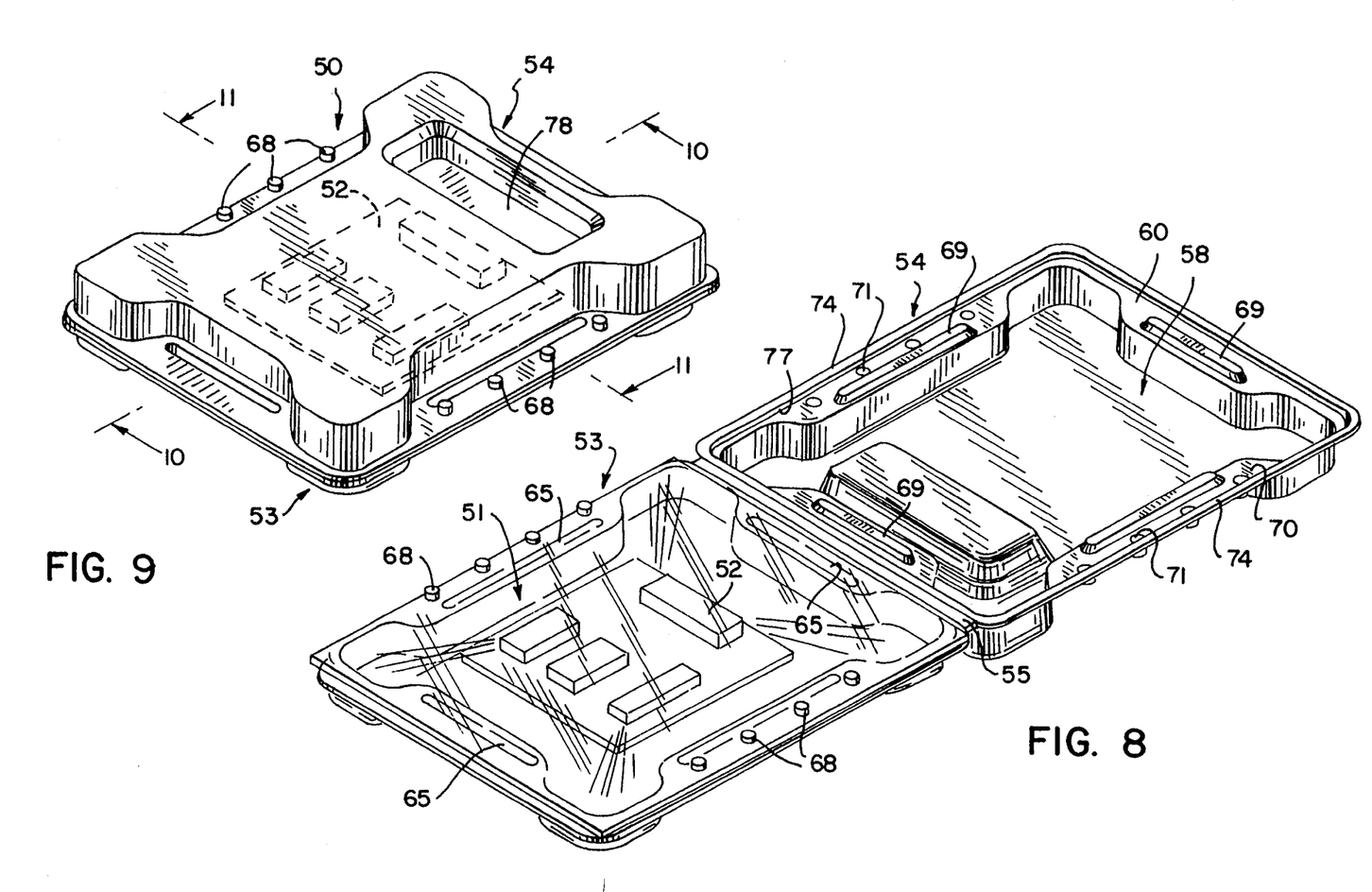
FIGS. 8 and 9 are, respectively, open and closed perspective views of an alternate embodiment of the package of the subject invention.
Figure 10:
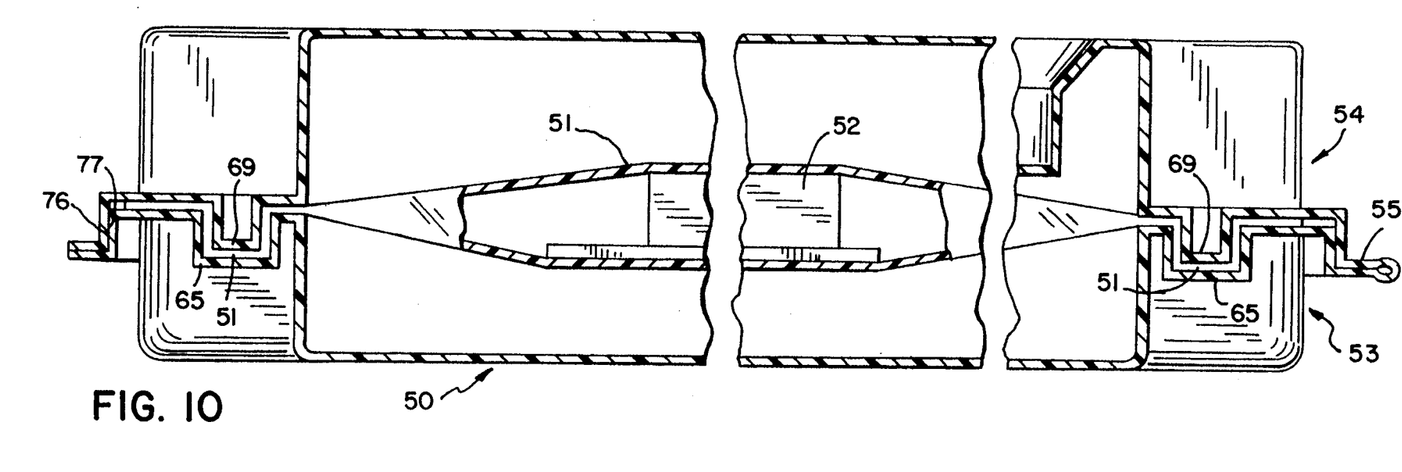
FIG. 10 is a sectional view taken on line 10—10 of FIG. 9.
Figure 11:
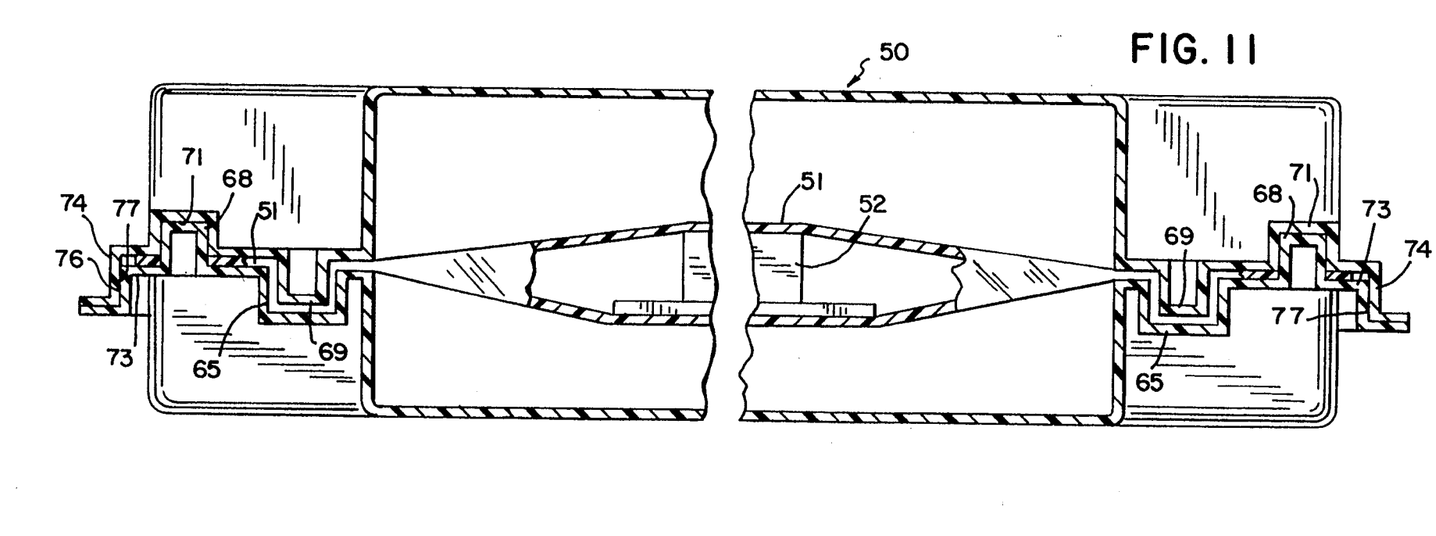
FIG. 11 is a sectional view taken on line 11—11 of FIG. 9.

Either of the outer walls 56 of the clamshell 50 may be provided with a recessed area 78 extending into the open interior 58 and, therefore, defining a cavity on the outside of the closed clamshell. The cavity can be used to hold tools, instructional materials, or the like, and closed with an outer thin film wrap, label, or other covering material. Also, the bag 11 or 51 of either embodiment may comprise two separate sheets or a single sheet folded over one edge. Bags that are smaller than the outer peripheral frame 17 or 57 of the respective embodiments may be used, so long as opposite edge margins of the bag overlie opposite shell edge portions where they are engaged by the tensioning mechanism upon closure.

The present invention provides a package which suspends a sensitive article within a protective outer clamshell to guard against physical shock, tensions the article in the bag to prevent potentially damaging sliding movement, and includes static dissipative materials which protect electrically sensitive products from transient electrical charges. Both the clamshell and the bag may be made from transparent materials to enhance visual access for retail display, internal processing and bar code scanning. A single size package can be used to house many product configurations, including circuit boards, a wide variety of other electronic devices, as well as many sensitive products which may not require static dissipative protection. The package of the present invention utilizes common packaging components and eliminates the need for cushioning foam, metalized bags, and corrugated paperboard materials, all of which are commonly used in prior art packaging systems. One particularly attractive thermoplastic material which is suitable for manufacturing the clamshell containers 10 or 50 is recycled PET, the economic and environmental benefits of which are significant.

Various modes of carrying out the present invention are contemplated as being within the scope of the following claims particularly pointing out and distinctly claiming the subject matter which is regarded as the invention.

We claim:

1. A suspension package for sensitive articles comprising:
   a pair of enclosing outer plastic shells having respective edge portions which abut to establish a closed shell position defining an article-enclosing package interior;
   an article-enclosing flexible bag having opposite marginal portions dimensioned to overlie the edge portions of one of said shells; and,
   a closure mechanism adapted to capture the marginal portions of the bag between the abutting edge portions of the shells in the closed shell position, to tension the bag in a direction transverse to said marginal portions and suspend the bag and enclosed article within the open package interior, and to hold the shells closed, said closure mechanism including mating tongue and groove connections on opposite pairs of abutting edge portions of the shells; and, opposite marginal edge portions of said bag captured in said mating tongue and groove connections in the closed shell position to provide said bag tension.

2. The package as set forth in claim 1 comprising an integral hinge interconnecting said outer shells to form a unitary clamshell.

3. The package as set forth in claim 1 wherein the closure mechanism includes patterns of interfitting protrusions and recesses on the edge portions of the shells.

4. The package as set forth in claim 1 comprising:
   perforations in opposite marginal portions of said bag; and,
   said closure mechanism including protrusions formed on opposite edge portions of one of said shells adapted to extend through said perforations and hold the bag marginal portions in the overlying position.

5. The package as set forth in claim 4 further comprising recesses formed in opposite edge portions of the other of said shells adapted to receive therein said protrusions and to establish the closed shell position.

6. The package as set forth in claim 1 wherein said plastic shells comprise a static dissipative material.

7. The package as set forth in claim 1 wherein said shells and said bag comprises a static dissipative material.

8. The package as set forth in claim 1 wherein said bag comprises a plastic film material.

9. The package as set forth in claim 8 wherein said plastic bag and said plastic shells are static dissipative.

10. The package as set forth in claim 1 wherein the closure mechanism includes:
    opposed wall portions along the inner peripheries of the edge portions of the shells; and,
    said wall portions adapted to operatively engage in the closed shell position to provide the bag tension and to hold said shells closed.

11. The package as set forth in claim 10 wherein said opposed wall portions comprise:
    a substantially continuous groove in the edge portions of one shell; and,
    a mating rib on the edge portion of the other shell.

12. The package as set forth in claim 11 wherein said groove and rib include undercut abutting faces adapted to lock said shells closed.

13. A suspension package for sensitive articles comprising:
    a pair of thermoformed plastic clamshell halves connected by an integral hinge, said clamshell halves having respective peripheral edge portions defining a generally rectangular shape, which edge portions abut to establish a closed shell position defining an enclosing interior;
    an article-enclosing flexible plastic bag having pairs of opposite marginal portions which overlie the edge portions of one clamshell half, one pair of marginal portions having perforations formed therein;
    a closure mechanism including protrusions formed in opposite edge portions of one of said clamshell halves adapted to extend through said perforations and hold the bag in the overlying position, recesses formed in opposite edge portions of the other clamshell half to receive therein said protrusions in the closed shell position, and opposed wall portions along the inner peripheries of said peripheral edge portions adapted to capture said marginal portions of said bag therebetween and to engage in the closed position to tension said bag and to hold said clamshell halves closed.

14. The package as set forth in claim 13 wherein said plastic clamshell and said plastic bag comprise static dissipative materials.

15. A method for packaging an article for protection against physical shock, said method comprising the steps of:
    (1) placing the article in a generally rectangular flexible plastic bag;
    (2) providing the bag with marginal connector portions along opposite bag edges;
    (3) providing a pair of plastic shell halves having respective edge portions defining generally rectangular peripheries;
    (4) providing the opposite edge portions of one shell with edge connector portions;
    (5) attaching the marginal connector portions to the edge connector portions to suspend the bag between said opposite edge portions;
    (6) providing the inner peripheral edges of the edge portions of both shell halves with interfitting wall portions; and,
    (7) closing the shell halves by bringing the edge portions into abutting face-to-face relation and tensioning the bag by capturing the same between the interfitting wall portions.

16. The method as set forth in claim 15 including the step of treating the plastic material for the bag and shell halves to render the material static dissipative.

17. The method as set forth in claim 15 including the steps of providing the interfitting wall portions with undercut faces and causing said wall portions to deflect on closing to lock the shell halves closed.

* * * * *